(12) United States Patent
Hung

(10) Patent No.: US 6,284,561 B1
(45) Date of Patent: Sep. 4, 2001

(54) METHOD OF FORMING A METAL PLATE OF A FINGERPRINT SENSOR CHIP ON A SEMICONDUCTOR WAFER

(75) Inventor: Tz-Ian Hung, Hsin-Ying (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/414,898

(22) Filed: Oct. 8, 1999

(51) Int. Cl.[7] ..................................................... H01L 21/00
(52) U.S. Cl. .................................................. 438/98; 438/48
(58) Field of Search ................................. 438/48, 57, 54, 438/98

(56) References Cited

U.S. PATENT DOCUMENTS

| | | | |
|---|---|---|---|
| 5,476,808 | * 12/1995 | Kusaka et al. | 437/53 |
| 6,046,068 | * 4/2000 | Orava et al. | 438/57 |
| 6,061,464 | * 5/2000 | Leger | 382/124 |

* cited by examiner

*Primary Examiner*—Vu A. Le
*Assistant Examiner*—Bradley Smith
(74) *Attorney, Agent, or Firm*—Winston Hsu

(57) ABSTRACT

The present invention provides a method of forming a metal plate on a semiconductor wafer. The semiconductor wafer comprises a first dielectric layer and two line-shaped conductors positioned on the first dielectric layer, and a recess is formed between the two conductors and above the surface of the first dielectric layer which comprises two corners. The method comprises forming a second dielectric layer uniformly on the two conductors and the recess, and forming a plurality of approximately rectangular metal plates on the second dielectric layer, then forming a passivation layer on the semiconductor wafer for protecting the inner circuitry. The surface of the passivation layer above the recess is higher than the surface of the passivation layer above the conductors, and the passivation layer formed above each metal plate has an even surface.

18 Claims, 4 Drawing Sheets

METHOD OF FORMING A METAL PLATE OF A FINGERPRINT SENSOR CHIP ON A SEMICONDUCTOR WAFER

BACKGROUND OF THE INVENTION

1. Field of the Invention

The present invention relates to a method of forming a metal plate on a semiconductor wafer, and more particularly, to a method of forming a metal plate of a fingerprint sensor chip on a semiconductor wafer.

2. Description of the Prior Art

The biometric sensor chip used for the prior art fingerprint detector is a semiconductor product. The biometric chip comprises approximately ninety thousand metal sensor plates arrayed in a 300×300 pixel matrix. This matrix is sandwiched between an inter-metal dielectric (IMD) and a passivation layer, and is used as the sensor array of the fingerprint detector.

When the finger of the user touches the passivation layer of the biometric sensor chip, each sensor plate in the sensor array detects the static voltage in its area relative to the finger. The changing topography of the finger causes relative changes in voltage in each sensor plate across the sensor array. This pattern of relative voltages generates an image of the fingerprint, which can be passed on to external circuitry for recognition.

Please refer to FIG. 1 and FIG. 2. FIG. 1 is a layout schematic diagram of a sensor plate 22 of the biometric sensor array of the prior art. FIG. 2 is a cross-sectional view along line 2—2 of the biometric sensor chip shown in FIG. 1. A prior art biometric sensor array comprises ninety thousand metal sensor plates 22, and each sensor plate 22 is formed on the surface of a semiconductor wafer 10. The semiconductor wafer 10 comprises a dielectric layer 12, a metallic line layer made of several interconnection lines 14 positioned on the dielectric layer 12, an IMD 15 covering the interconnection lines 14 and the dielectric layer 12, a metal plate positioned on the IMD 15 to be a sensor plate 22, and a passiviation layer 24 covering the sensor plate 22 and the IMD 15 to protect the circuitry on the semiconductor wafer 10. The IMD 15 is a compound structure which comprises spin on glass (SOG) 18 and a silicon oxide layer 20.

In the formation of the prior art biometric sensor chip, a dielectric layer 12 is deposited on the surface of the semiconductor wafer 10, then a first metallic layer is formed on the dielectric layer 12 and is processed into the interconnection lines 14 using photolithography and etching. These interconnection lines 14 electrically connect the sensor array to the image recognition circuit of the biometric sensor chip, or to other internal circuitry. An SOG 18 is formed on the interconnection lines 14 and the dielectric layer 12 to form a spacer on both sides of each interconnection line 14 which smoothes the corners between each interconnection line 14 and the dielectric layer 12. Next, a silicon oxide layer 20 is formed on the interconnection lines 14 and the dielectric layer 12 to prevent the interconnection lines 14 from being corroded by subsequent processes, and which completes the formation of the IMD 15 compound structure.

After the IMD 15 is formed on the semiconductor wafer 10, a second metallic layer is formed on the silicon oxide layer 20 which also undergoes photolithography and etching to form the sensor plates 22. Finally, a passiviation layer 24 is formed on the sensor plates 22 and the IMD 15 to protect the circuitry on the semiconductor wafer 10. When the finger of the user touches the passivation layer 24, each sensor plate 22 senses the static voltage in its area relative to the finger, and all ninety thousand sensor plates 22 together make a relative fingerprint image.

However, the area between each interconnection line 14 is very uneven with the SOG spacers 18 and the interconnection lines themselves. Consequently, the silicon oxide 20, which is of uniform thickness and which is formed across this uneven surface, is not a level surface. When the metal sensor plates 22 are formed on this uneven silicon oxide layer 20, they become distorted, with raised edges and a sunken center. Such non-planar metal sensor plates adversely affect the sensitivity and accuracy of the entire sensor chip as the distance from an individual sensor plate to the user's finger is not consistent across the area of the sensor plate.

Furthermore, the uneven topography of the sensor plates 22 causes the passivation layer 24 to be uneven. This is especially true when the passivation layer 24 is deposited on the raised edges of the sensor plates 22, which causes peaks and valleys to form in the passivation layer 24. Consequently, when the biometric sensor chip is mounted on a printed circuit board (PCB) and it undergoes a cleaning process, the high-pressure water used in cleaning will strike the slopes of the passivation layer 24 and generate cracks. Water droplets will then be able to infiltrate down into the interconnection layer through these cracks and cause short-circuiting. The cracks also weaken the passivation layer 24 of the biometric sensor chip, making it more susceptible to damage during packaging and actual use.

SUMMARY OF THE INVENTION

It is therefore a primary objective of the present invention to provide a method of forming a metal plate of a fingerprint sensor chip on a semiconductor wafer to solve the above mentioned problems.

In a preferred embodiment, the present invention relates to a method of forming a metal plate on a semiconductor wafer, the semiconductor wafer comprising a first dielectric layer and two line-shaped conductors positioned on the first dielectric layer, each of the two line-shaped conductors comprising two vertical side walls positioned on its two opposite sides, a recess being formed between the two conductors and above the surface of the first dielectric layer, and the recess comprising two corners formed between the two vertical side walls of the two conductors in the recess and the surface of the first dielectric layer, the method comprising:

forming two spacers at the two corners of the recess by using a filling material to create two slopes above the two corners;

forming a second dielectric layer uniformly on the two conductors and the recess, the second dielectric layer positioned on the recess creating a shallow trench on its top end and its bottom end being higher than the top ends of the two conductors;

forming an approximately rectangular photoresist layer on the shallow trench;

performing a dry-etching process to vertically remove the second dielectric layer positioned on the two conductors and making the top end of the second dielectric layer positioned on each of the two conductors lower than the bottom end of the shallow trench;

removing the photoresist layer;

forming a sacrifice layer on the surface of the second dielectric layer by using a spin-coating method;

performing an etching-back process on the sacrifice layer and the second dielectric layer to form an approximately rectangular platform above the recess and two shallow trenches above the two conductors;

forming an approximately rectangular metal plate on top of the platform; and forming a third dielectric layer uniformly on the semiconductor wafer for protecting the metal plate.

It is an advantage of the present invention that the passivation layer on the metal sensor plate has a very even surface, which can improve the sensitivity and the accuracy of the fingerprint sensor chip.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
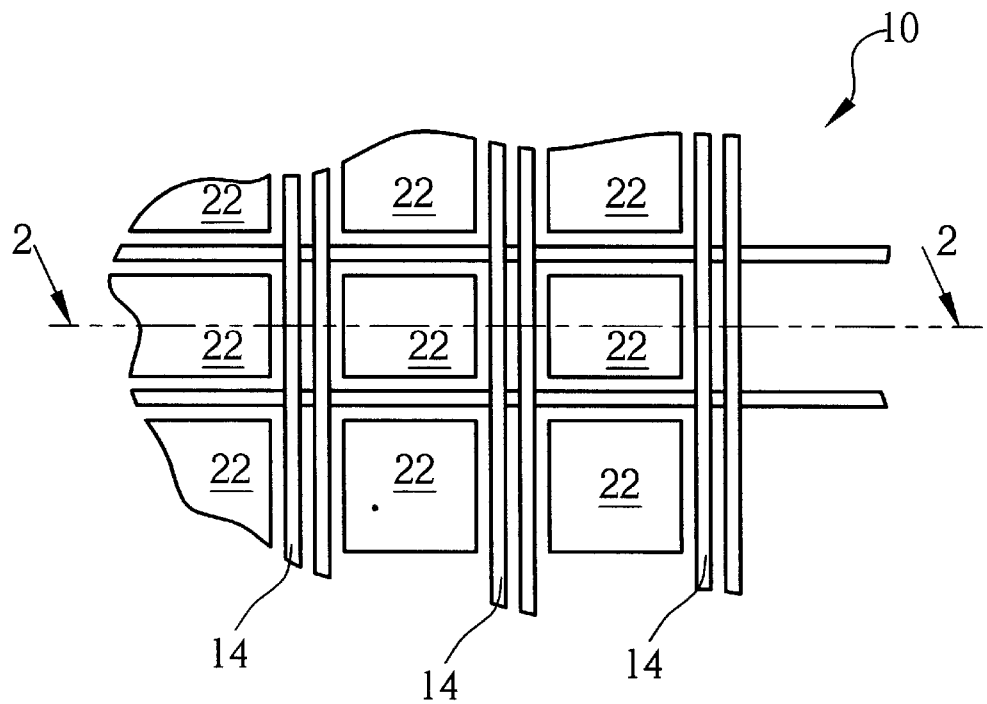
FIG. 1. is a layout schematic diagram of the sensor plate 22 of the biometric sensor chip of the prior art.
Figure 2:
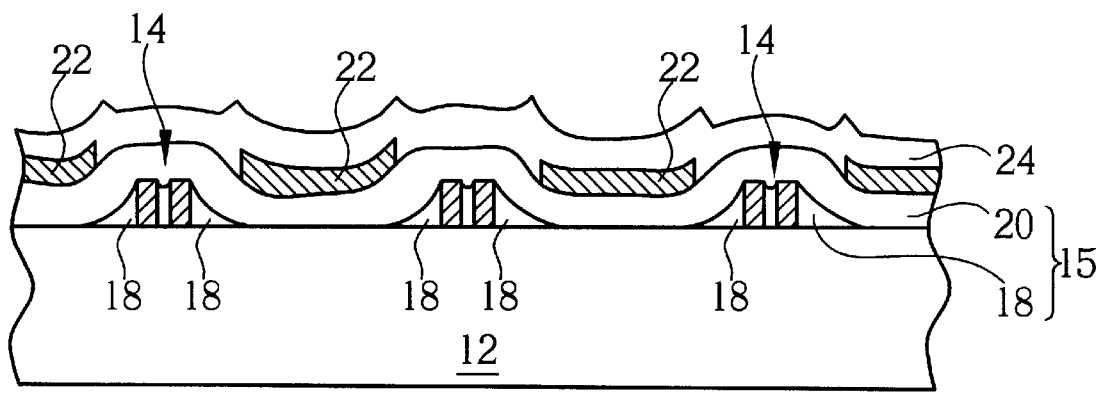
FIG. 2 is a cross-section view along line 2—2 of the biometric sensor chip shown in FIG. 1.
Figure 3:
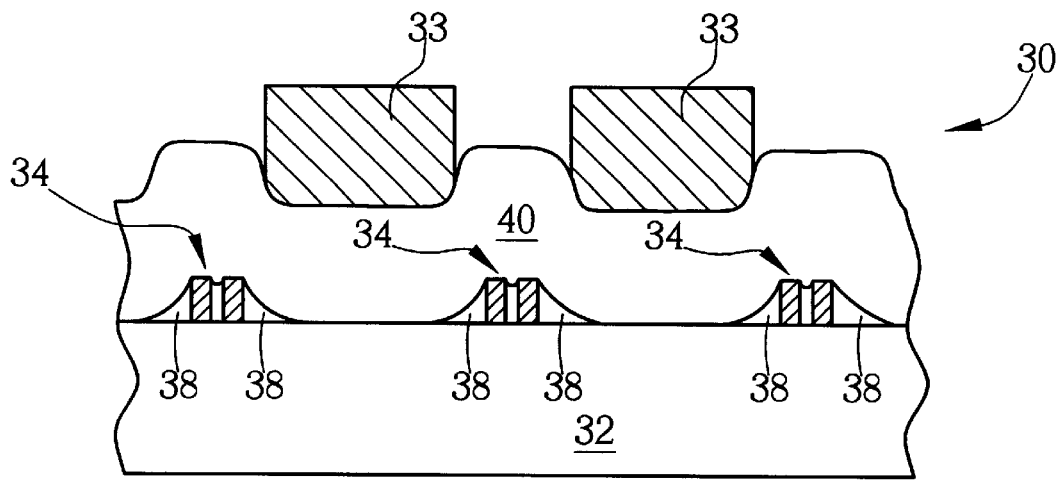
FIG. 3 to FIG. 6 are schematic diagrams of forming a metal sensor plate on the biometric sensor chip according to the present invention.

Please refer to FIG. 3 to FIG. 6. FIG. 3 to FIG. 6 are schematic diagrams of forming a metal sensor plate on the biometric sensor chip according to the present invention. The present invention provides a method of forming a metal plate on a semiconductor wafer 30, and this metal plate serves as a metal sensor plate 42 of the fingerprint sensor array. The semiconductor wafer 30 comprises a first dielectric layer 32 with a plurality of rectangular sensor areas arranged as a matrix, a second dielectric layer 40 positioned on these sensor areas, a plurality of rectangular metal sensor plates 42 positioned on the second dielectric 40 above each sensor area, and a passivation layer 46 positioned on the surface of the semiconductor wafer 30 covering the metal sensor plates 42 and the second dielectric layer 40 to protect the underlying circuitry. The periphery of each sensor area has two line-shaped conductors 34 positioned on it to serve as interconnection lines to connect to the image recognition circuit of the biometric sensor chip or other internal circuitry. The two vertical walls of each of the two conductors 34 and the surface of the first dielectric layer 32 forms a recess that has two corners.

The first step of the method of forming a metal sensor plate 42 of a fingerprint sensor chip in the present invention utilizes a solution such as silicate dissolved in alcohol or ketone, or siloxane with a functioning group. A spinning method is used to coat this solution onto the semiconductor wafer 30, and then a dehydration baking process is performed to form an SOG layer (not shown). SOG has some advantages, such as good filling and step coverage abilities, and so it has been used as the material for filling the spaces between each conductor 34. Next, an anisotropic etching back process is performed to remove the SOG above each conductor 34, forming a spacer 38 on the corner of the recess to smooth the walls of the conductors 34. Then, a plasma enhanced chemical vapor deposition (PECVD), which takes tetra-ethyl-ortho-silicate (TEOS) as the reactive gas, is performed on the semiconductor wafer 30 to forma uniform-seconddielectric layer 40 of silicon oxide that covers each conductor 34 and the spacers 38 and fills each recess. The surface of the second dielectric layer 40 is lower above the recess, and higher above the conductors 34.

Figure 4:
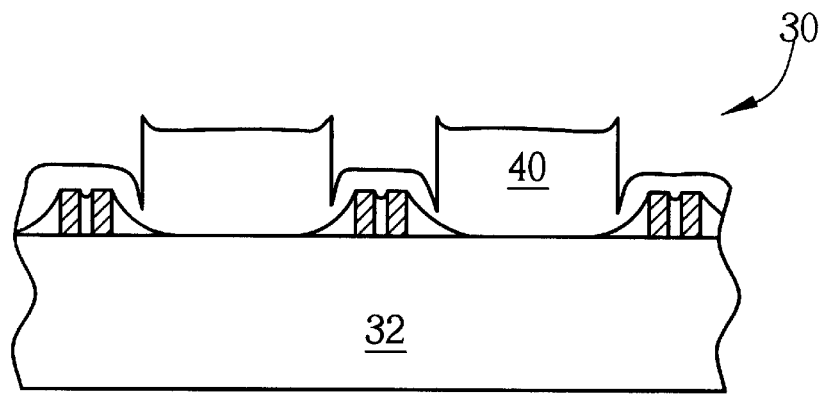

A lithographic process is performed on a predetermined region of the second dielectric layer 40 to form a rectangular photoresist layer 33 to be the mask for defining the position of the metal sensor plate 42 above the recess. As shown in FIG. 4, a dry etching process is performed on the semiconductor wafer 30 to vertically remove the second dielectric layer 40 not covered by the photoresist layer 33. The surface of the second dielectric layer 40 is then lower where it is above the conductors 34, and higher where it is above the recess.

Figure 5:
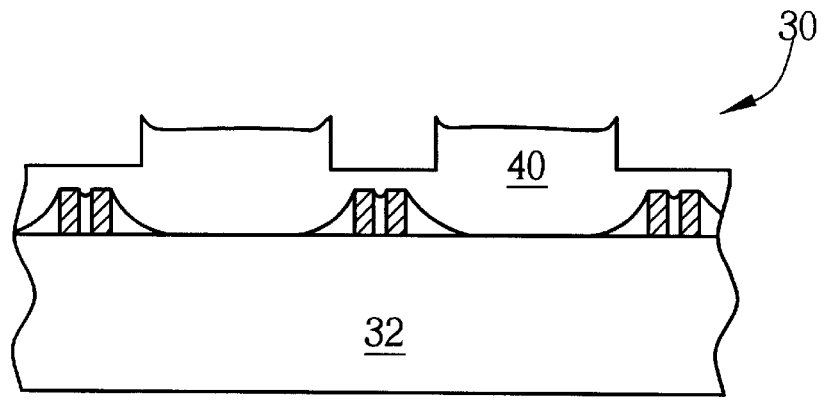
Figure 6:
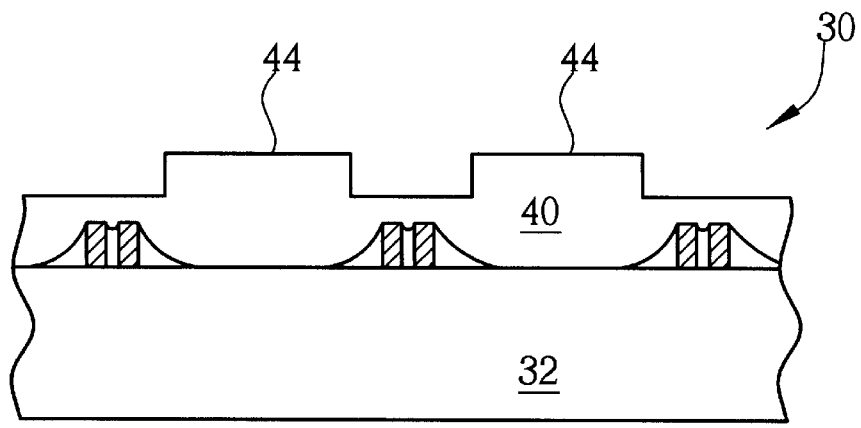

As shown in FIG. 5, after completely removing the photoresist layer 33, a spin-coating method is used to form an SOG sacrifice layer on the surface of the second dielectric layer 40. As shown in FIG.6, an etching-back process is performed on the sacrifice layer and the dielectric layer 40 to form an approximately rectangular platform 44 above the recess. The height of each platform 44 is greater than the surface height of the second dielectric layer 40 above each conductor 34. The comparative etching ratio of the second dielectric layer 40 to the sacrifice layer is 0.9~1.2 during the etching-back process.

Figure 7:
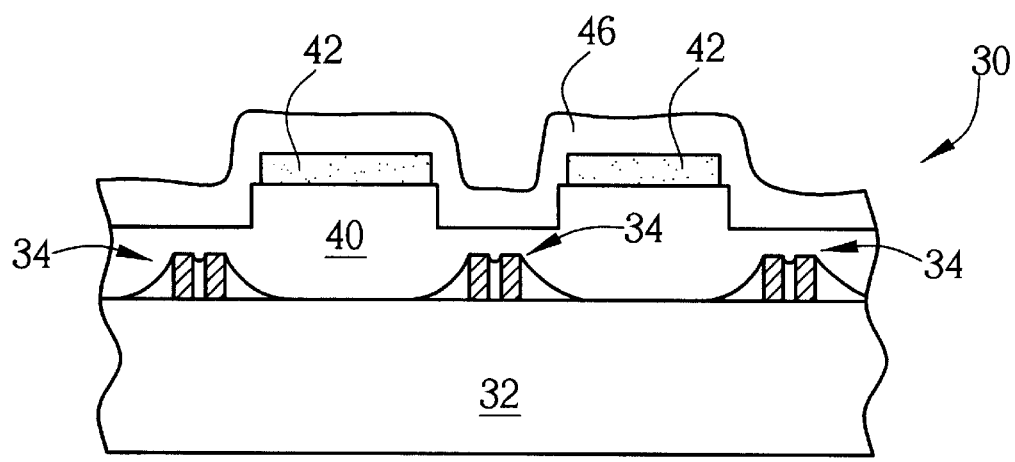
FIG. 7 to FIG. 10 are schematic diagrams of forming a metal sensor plate on the biometric sensor chip according to the present invention in an alternative condition.

As shown in FIG. 7, a uniform metal layer is formed on the second dielectric layer 40, and a lithographic process is performed to remove the metal layer outside the platform 44, forming the metal sensor plate 42. Finally, a third dielectric layer 46 made of silicon nitride is formed on the semiconductor wafer to act as the passivation layer for protecting the fingerprint sensor plate.

In the formation of the metal sensor plate 42, the two spacers 38 are first formed on the semiconductor wafer 30 to smooth the surface. A lithographic etching process is then performed on the second dielectric layer 40 to form the level platforms 44 to horizontally support each metal sensor plate 42. Each metal sensor plate 42 has an even surface, and thus the third dielectric layer 46 deposited on the metal sensor plate 42 also has an even surface.

Because of the even surface of the third dielectric layer 46, when the user's finger touches the surface of the biometric sensor chip, the distance from the metal sensor plate 42 to the surface of the finger will be uniform, and thus the sensitivity and the accuracy of the sensor array is better than that of the prior art. The damage caused by subsequent cleaning processes on an uneven surface is also reduced. Furthermore, because the height of each platform 44 is greater than the surface height of the second dielectric layer 40 above each conductor 34, there is no electrical interference between the metal sensor plate 42 and each conductor 34.

Figure 8:
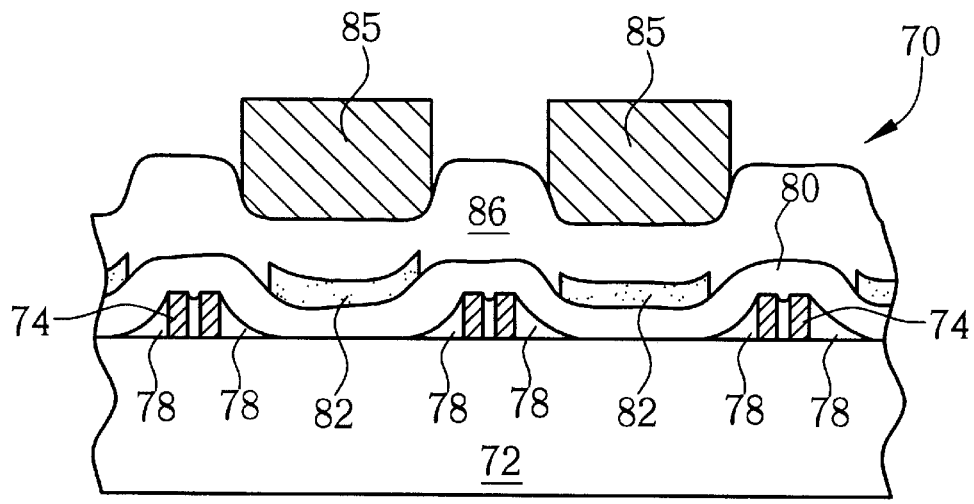
Figure 9:
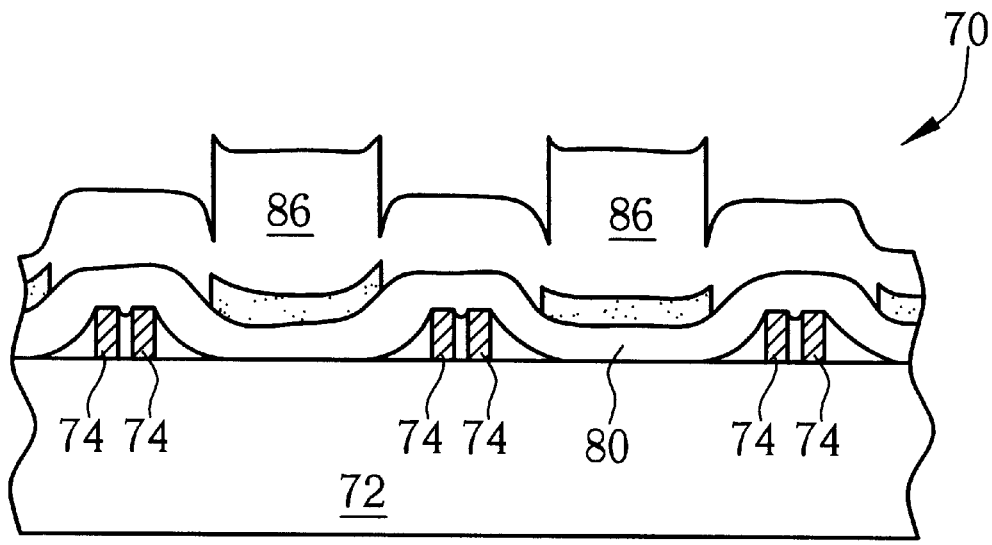
Figure 10:
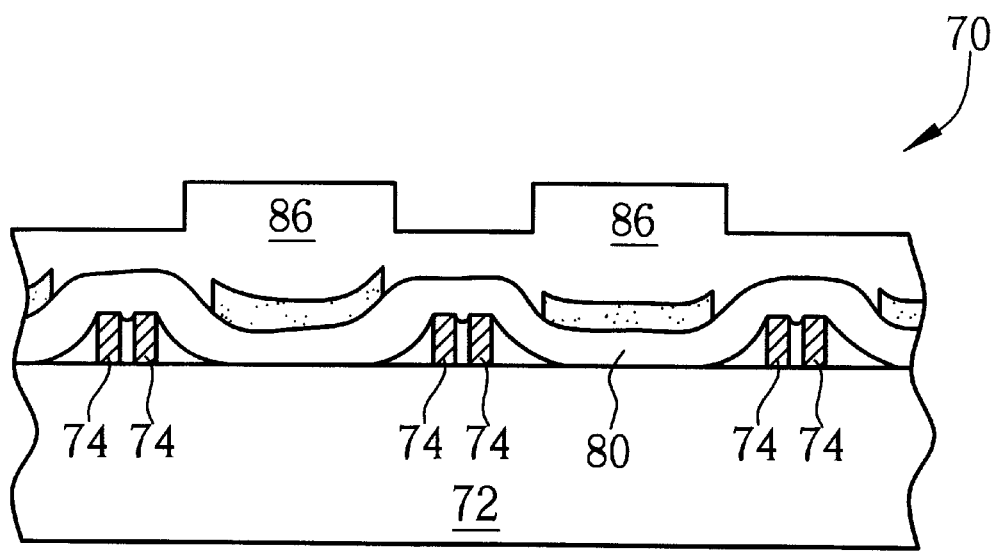

Please refer to FIG. 8 to FIG. 10. FIG. 8 to FIG. 10 are schematic diagrams of forming a metal sensor plate on the biometric sensor chip according to the present invention in an alternative condition. The semiconductor wafer 70 comprises a first dielectric layer 72, a plurality of lined-shaped conductors 74 on the first dielectric layer 72, and a uniform second dielectric layer 80 positioned on the surface of the semiconductor wafer 70. A recess is formed between the two conductors 74 above the surface of the first dielectric layer 72. The second dielectric layer 80 covers each conductor 74 and fills the recess. The bottom of the second dielectric layer 80 on each conductor 74 is higher than the top of the second dielectric layer 80 above the recess.

Each conductor 74 comprises at least two parallel, unconnected metallic wires that electrically interconnect to the image recognition circuit of the chip, or to other internal circuitry. Both walls of each conductor 74 comprise a spacer 78 made of SOG to create two slopes in the two corners of the recess.

Next, a uniform metal layer is formed on the semiconductor wafer 70, covering the second dielectric layer 80. Lithographic and etching processes are performed to form a plurality of metal sensor plates 82. Then, a third dielectric layer 86 is uniformly formed on the surface of the semiconductor wafer 70 to cover the second dielectric layer 80 and the metal sensor plates 82.

As shown in FIG. 8, a lithographic process is performed to form a rectangular photoresist layer 85 on the third dielectric layer 86 positioned above the metal sensor plates 82. A dry etching process is performed to vertically remove the third dielectric layer 86 above the two conductors 74 so that the surface of the dielectric layer 86 above each of the two conductors 74 is lower than the surface of the third dielectric layer 86 below the photoresist layer 85, as shown in FIG. 9.

As shown in FIG. 10, after the photoresist layer 85 on the semiconductor wafer 70 is removed, a sacrifice layer made of SOG (not shown) is formed on the dielectric layer 86. An etching-back process is performed on the third dielectric layer 86 and the sacrifice layer to form an approximately rectangular platform on the surface of the third dielectric layer 86 above the metal plate 82. In the alternative method of forming the metal sensor plate 82, the third dielectric layer 86 undergoes lithographic and etching processes so that it has an even surface above the metal sensor plate 82. This prevents the biometric sensor chip from being damaged during the PCB mounting and cleaning processes, and during actual use.

Furthermore, before the formation of the spacer 38, 78, a chemical vapor deposition (CVD) is performed on the surface of each conductor 34, 74 and the recess to uniformly form a passivation layer made of silicon rich oxide (SRO) to prevent the conductors 34, 74 from being corroded by the subsequent processes.

In contrast to the prior art method, the height of the passivation layer over each metal sensor plate is greater than the height of the passivation layer over each conductor, and the passivation layer over each metal sensor plate has an even surface. Hence, the surface of the passivation layer should not crack during the cleaning process of a PCB packaging process, as the prior art may. Furthermore, because the passivation layer of the biometric sensor chip has an even surface, the distance from the metal sensor plate to the finger of the user will be more uniform, thereby improving the sensitivity and accuracy of the fingerprint sensor chip.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a metal plate on a semiconductor wafer, the semiconductor wafer comprising a first dielectric layer and two line-shaped conductors positioned on the first dielectric layer, each of the two line-shaped conductors comprising two vertical side walls positioned on its two opposite sides, a recess being formed between the two conductors and above the surface of the first dielectric layer, and the recess comprising two corners formed between the two vertical side walls of the two conductors in the recess and the surface of the first dielectric layer, the method comprising:

forming two spacers at the two corners of the recess by using a filling material to create two slopes above the two corners;

forming a second dielectric layer on the two conductors and the recess, the second dielectric layer positioned on the recess creating a shallow trench on its top end and its bottom end being higher than the top ends of the two conductors;

forming an approximately rectangular photoresist layer on the shallow trench;

performing a dry-etching process to vertically remove the second dielectric layer positioned on the two conductors and making the top end of the second dielectric layer positioned on each of the two conductors lower than the bottom end of the shallow trench;

removing the photoresist layer;

forming a sacrifice layer on the surface of the second dielectric layer by using a spin-coating method;

performing an etching-back process on the sacrifice layer and the second dielectric layer to form an approximately rectangular platform above the recess and two shallow trenches above the two conductors, and the comparative etching ratio of the second dielectric layer to the sacrifice layer is 0.9~1.2 during the etching-back process;

forming a metal layer on the second dielectric layer and performing a photolithographic process and an etching process to remove the metal layer outside the platform so as to form an approximately rectangular metal plate on top of the platform; and forming a third dielectric layer on the semiconductor wafer for protecting the metal plate.

2. The method of claim 1 wherein each of the conductors is a metallic wire.

3. The method of claim 1 further comprising a step before forming the two spacers:

performing a chemical vapor deposition (CVD) process to uniformly form a protective layer on the two conductors and the recess, the protective layer being formed by using silicon rich oxide (SRO) to protect the two conductors from erosion by the materials in the subsequent steps.

4. The method of claim 1 wherein the filing material is spin on glass (SOG).

5. The method of claim 4 wherein the two spacers positioned inside the recess are formed by the steps listed below:

coating the filling material on the second dielectric layer by using a spin-coating method; and performing an anisotropic etching-back process to remove the filling material positioned on the two conductors and the remaining filling material positioned at the two corners of the recess forming the two spacers.

6. The method of claim 1 wherein the second dielectric layer is formed by silicon oxide which is created by performing a plasma enhanced chemical vapor deposition (PECVD) process employing tetetra-ethyl-ortho-silicate (TEOS, $Si(OC_2H_5)_4$) as the reactant.

7. The method of claim 1 wherein the sacrifice layer is formed by spin on glass (SOG).

8. The method of claim 1 wherein the metal plate is used as a sensor plate of a fingerprint sensor chip.

9. A method of forming a metal plate on a semiconductor wafer, the semiconductor wafer comprising a first dielectric layer and two line-shaped conductors positioned on the first dielectric layer, each of the two line-shaped conductors comprising two vertical side walls positioned on its two opposite sides, a recess being formed between the two conductors and above the surface of the first dielectric layer, and the recess comprising two corners formed between the two vertical side walls of the two conductors in the recess and the surface of the first dielectric layer, the method comprising:

forming two spacers at the two corners of the recess by using a filling material to create two slopes above the two corners;

forming a second dielectric layer uniformly on the two conductors and the recess, the second dielectric layer positioned on the recess creating a shallow trench on its top end and its bottom end being higher than the top ends of the two conductors;

forming an approximately rectangular metal plate inside the recess;

forming a third dielectric layer uniformly on the second dielectric layer and the metal plate;

forming an approximately rectangular photoresist layer on the third dielectric layer and positioned above the metal plate;

performing a dry-etching process to vertically remove the third dielectric layer positioned on the two conductors and making the top end of the third dielectric layer positioned on each of the two conductors lower than the top end of the third dielectric layer positioned below the photoresist layer;

removing the photoresist layer;

forming a sacrifice layer on the third dielectric layer by using a spin-coating method; and performing an etching-back process on the third dielectric layer and the sacrifice layer to form an approximately rectangular platform on the surface of the third dielectric layer above the metal plate and two shallow trenches above the two conductors.

10. The method of claim 9 wherein each of the conductors is a metallic wire.

11. The method of claim 9 further comprises a step before forming the two spacers:

performing a chemical vapor deposition (CVD) process to uniformly form a protective layer on the two conductors and the recess, the protective layer being formed by using silicon rich oxide (SRO) for protecting the two conductors from erosion by the materials in the subsequent steps.

12. The method of claim 9 wherein the filling material is formed by spin on glass (SOG).

13. The method of claim 12 wherein the two spacers positioned inside the recess are formed by the steps listed below:

coating the filling material on the second dielectric layer by using a spin-coating method; and performing an anisotropic etching-back process to remove the filling material positioned on the two conductors and the remaining filling material positioned at the two corners of the recess forming the two spacers.

14. The method of claim 9 wherein the second dielectric layer is formed by silicon oxide which is created by performing a plasma enhanced chemical vapor deposition (PECVD) process employing tetetra-ethyl-ortho-silicate (TEOS, $Si(OC_2H_5)_4$) as the reactant.

15. The method of claim 9 wherein the sacrifice layer is formed by spin on glass (SOG).

16. The method of claim 9 wherein the comparative etching ratio of the second dielectric layer to the sacrifice layer is 0.9~1.2 during the etching-back process.

17. The method of claim 9 wherein the metal plate is used as a sensor plate of a fingerprint sensor chip.

18. The method of claim 9 wherein the metal plate is formed by the steps listed below:

forming a metal layer uniformly on the second dielectric layer; and performing a photolithography process and an etching process to remove the metal layer outside a rectangular region in the shallow trench so as to form the metal plate.

* * * * *